United States Patent
Farkas et al.

(10) Patent No.: US 7,460,030 B2
(45) Date of Patent: Dec. 2, 2008

(54) SYSTEM AND METHOD FOR ENCODER FAILURE DETECTION

(75) Inventors: Kenneth J. Farkas, Brighton, MI (US); Duo Deng, Canton, MI (US)

(73) Assignee: Continental Automotive Systems US, Inc., Auburn Hills ( * ) Notice: Subject to any disclaimer, the term of this patent is extended or adjusted under 35 U.S.C. 154(b) by 0 days.

(21) Appl. No.: 11/567,157

(22) Filed: Dec. 5, 2006

(65) Prior Publication Data

US 2008/0129549 A1  Jun. 5, 2008

(51) Int. Cl.
*H03M 1/22* (2006.01)

(52) U.S. Cl. ............................................. 341/11; 341/2

(58) Field of Classification Search .................. 341/11, 341/13, 2; 250/208, 209, 237, 231
See application file for complete search history.

(56) References Cited

U.S. PATENT DOCUMENTS

| | | | | |
|---|---|---|---|---|
| 3,808,431 A * | 4/1974 | Hedrick | | 341/2 |
| 4,461,015 A | 7/1984 | Kulhavy | | 377/24 |
| 4,597,081 A | 6/1986 | Tassone | | 371/25 |
| 4,796,005 A | 1/1989 | Ishida et al. | | 341/11 |
| 4,882,529 A | 11/1989 | Kobari et al. | | 318/602 |
| 5,058,145 A | 10/1991 | Hauck et al. | | 377/17 |
| 5,128,536 A | 7/1992 | Higashi | | 250/231.16 |
| 5,257,672 A | 11/1993 | Ohtagaki et al. | | 180/249 |
| 5,345,048 A | 9/1994 | Towey, Jr. | | 187/116 |
| 5,357,181 A | 10/1994 | Mutoh et al. | | 318/139 |
| 5,407,024 A | 4/1995 | Watson et al. | | 180/248 |
| 5,650,779 A | 7/1997 | Sugden | | 341/9 |
| 5,723,858 A | 3/1998 | Sugden | | 250/231.13 |
| 6,246,343 B1 | 6/2001 | Deng et al. | | 341/11 |
| 6,373,211 B1 * | 4/2002 | Henry et al. | | 318/432 |
| 6,480,771 B2 | 11/2002 | Nishida et al. | | 701/34 |
| 2004/0008002 A1 | 1/2004 | Kamio et al. | | 318/701 |
| 2005/0156550 A1 | 7/2005 | Kamio et al. | | 318/445 |
| 2005/0182591 A1 | 8/2005 | Taniguchi et al. | | 702/142 |
| 2006/0021450 A1 | 2/2006 | Nallapa | | 73/862.326 |

FOREIGN PATENT DOCUMENTS

| | | |
|---|---|---|
| JP | 4-148046 | 5/1992 |
| JP | 5-036176 | 2/1993 |
| JP | 6-178569 | 6/1994 |
| JP | 8-336299 | 12/1996 |
| JP | 2000-351558 | 12/2000 |
| JP | 2001-079041 | 3/2001 |
| JP | 2003-165201 | 6/2003 |
| JP | 2003-299385 | 10/2003 |

* cited by examiner

*Primary Examiner*—Jean B. Jeanglaude
*Assistant Examiner*—Joseph Lauture

(57) ABSTRACT

An encoder failure detector system and method for detecting failure of an encoder during time periods when a zero rotational speed is expected. For example, in one embodiment a test signal is applied during a period when a zero rotational speed is expected and a failure is indicated if no movement of a rotor is detected in response to the test signal.

33 Claims, 7 Drawing Sheets

SYSTEM AND METHOD FOR ENCODER FAILURE DETECTION

BACKGROUND OF THE INVENTION

1. Field of the Invention

This disclosure generally relates to encoders, and more particularly to detection of failures in increment encoders.

2. Description of the Related Art

Increment encoders are used to determine the rotational velocity, acceleration, direction and/or the position of a rotating object in a machine, such as a shaft of an electric motor or generator. This information can be used to control the machine. For example, in electric/hybrid motor vehicles information from an encoder is typically provided to a control unit that can use the information together with other information to control the motor vehicle.

A failed encoder can lead to abnormal behaviors of a machine. Thus, methods for detecting and responding to the failure of an encoder have been developed. For example, a control unit can be programmed to generate appropriate control signals in response to an indication that an encoder has failed, such as control signals shutting down a machine, such as a motor vehicle.

Conventional methods of detecting encoder failure are directed to detecting failure above a certain threshold rotational speed because failures at a zero rotational speed are difficult to detect due to challenges in measuring low rotational speeds. The threshold minimum rotational speed will vary based on the characteristics of a particular machine. Conventional error detection schemes also are likely to produce many inaccurate indications of encoder failure at a zero rotational speed, which also is undesirable.

BRIEF SUMMARY OF THE INVENTION

In one embodiment, an encoder failure detector system and method for detecting failure of an encoder detect failure of an encoder during time periods when a zero rotational speed is expected. For example, in one embodiment a test signal is applied during a period when a zero rotational speed is expected and a failure is indicated if no movement of a rotor is detected in response to the test signal.

In one embodiment, a machine comprises a rotatable component, and a control system, the control system comprising an encoder configured to generate a signal in response to rotational movement of the rotatable component and coupled to the rotatable component, a torque and flux control configured to generate a control signal to control the rotatable component, and an encoder failure detector configured to monitor the signal generated by the encoder, monitor the control signal, monitor a current, selectively apply a test signal when the monitoring satisfies a zero-speed test signal application criteria, and selectively generate an encoder failure signal based on a response to the application of the test signal. In one embodiment, the encoder is configured to generate a pulse in response to a movement of the rotatable component. In one embodiment, the test signal is a pulse applied to the control signal. In one embodiment, the test signal is a pulse causing a magnitude of the monitored current to move toward zero. In one embodiment, the zero-speed test signal application criteria comprise the signal generated by the encoder remaining consistent with no measured rotational movement of the rotatable component for a threshold period of time, and an absolute value of the monitored current remaining above a calibration value for the threshold period of time. In one embodiment, the encoder failure detector is further configured to apply a first filter and a second filter to the control signal, and the zero-speed test signal application criteria further comprise a difference between the first filtered control signal and the second filtered control signal remaining below a threshold difference value for the threshold period of time. In one embodiment, the encoder failure detector is further configured to apply a first filter and a second filter to the control signal and the zero-speed test signal application criteria further comprise a difference between the first filtered control signal and the second filtered control signal being below a threshold difference value after the threshold period of time has elapsed. In one embodiment, the encoder failure detector is configured to selectively generate the encoder failure signal when the signal generated by the encoder remains consistent with no rotational movement of the rotatable component for a duration of the test signal. In one embodiment, the encoder failure detector is configured to generate the encoder failure signal when the zero-speed test signal application criteria remain satisfied for a duration of the test signal.

In one embodiment, a method of detecting a failure of an increment encoder in a machine comprises determining whether a zero-speed test signal application criteria is satisfied, and when the zero-speed test signal application criteria is satisfied, applying a test signal, measuring a response to the test signal, and selectively generating a signal indicating an encoder failure based on the measured response to the test signal. In one embodiment, measuring the response to the test signal comprises counting a number of pulses in an encoder channel output. In one embodiment, measuring the response to the test signal comprises determining whether the zero-speed test signal application criteria remain satisfied during the application of the test signal and selectively generating the signal indicating an encoder failure comprises generating the signal indicating an encoder failure when it is determined that the zero-speed test signal application criteria remained satisfied during the application of the test signal. In one embodiment, applying the test signal comprises applying a pulse to a control signal. In one embodiment, the pulse causes a magnitude of a current to move toward zero. In one embodiment, determining whether the zero-speed test signal application criteria is satisfied comprises determining whether a signal indicating movement of a rotatable component is received from the encoder during a threshold period of time, and determining whether a magnitude of a current remains above a calibration value for the threshold period of time. In one embodiment, determining whether the zero-speed test signal application criteria is satisfied further comprises applying a first filter and a second filter to a control signal, and determining whether a difference between the first filtered control signal and the second filtered control signal remains below a threshold difference value for the threshold period of time. In one embodiment, the current is a commanded torque current and the control signal is a D-axis voltage control signal. In one embodiment, determining whether the zero-speed test signal application criteria is satisfied further comprises applying a first filter and a second filter to a control signal, and determining whether a difference between the first filtered control signal and the second filtered control signal is below a threshold difference value after the threshold period of time has elapsed. In one embodiment, selectively generating the signal indicating an encoder failure comprises generating the signal indicating an encoder failure when a signal indicating movement of a rotatable component is not received from the encoder during application of the test signal.

In one embodiment, a control system comprises means for detecting movement of a rotatable component, means for controlling movement of the rotatable component, and means for detecting a failure of the means for detecting movement of the rotatable component, coupled to the means for detecting movement of the rotatable component and to the means for controlling movement of the rotatable component, wherein the means for detecting a failure of the means for detecting movement of the rotatable component selectively applies a test signal when a zero-speed test signal application criteria is satisfied and selectively generates an encoder failure signal based on a response to the test signal. In one embodiment, the means for detecting movement of the rotatable component comprises an encoder configured to generate a signal in response to a rotational movement of the rotatable component, the means for controlling movement of the rotatable component comprises a torque and flux control configured to generate a control signal, and the means for detecting a failure of the means for detecting movement of the rotatable component comprises an encoder failure detector configured to monitor the signal generated by the encoder, monitor the control signal, monitor a current, selectively apply the test signal when the monitoring satisfies the zero-speed test signal application criteria, and selectively generate the encoder failure signal based on the response to the application of the test signal. In one embodiment, the test signal is a pulse applied to the control signal. In one embodiment, the test signal is a pulse causing a magnitude of the current to move toward zero. In one embodiment, the means for detecting a failure of the means for detecting movement of the rotatable component is configured to selectively determine the zero-speed test signal application criteria is satisfied when, no movement of the rotatable component is detected by the means for detecting movement of the rotatable component for a threshold period of time, an absolute value of a current remains above a calibration value for the threshold period of time, and a difference between a first filtered value of a control signal generated by the means for controlling the rotatable component and a second filtered value of the control signal remains below a threshold difference for the threshold period of time. In one embodiment, the current is a torque current and the control signal is a D-axis voltage control signal. In one embodiment, the means for detecting a failure of the means for detecting movement of the rotatable component is configured to generate the encoder failure signal when the zero-speed test signal application criteria remain satisfied for a duration of the test signal.

In one embodiment, a computer-readable medium stores instructions for causing a control system to facilitate detection of a failed increment encoder by performing a method comprising determining whether a zero-speed test signal application criteria is satisfied, and when the zero-speed test signal application criteria is satisfied, applying a test signal, measuring a response to the test signal, and selectively generating a signal indicating an encoder failure based on the measured response to the test signal. In one embodiment, measuring the response to the test signal comprises counting a number of pulses in an encoder channel output. In one embodiment, measuring the response to the test signal comprises determining whether the zero-speed test signal application criteria remain satisfied during the application of the test signal and selectively generating the signal indicating an encoder failure comprises generating the signal indicating an encoder failure when it is determined that the zero-speed test signal application criteria remained satisfied during the application of the test signal. In one embodiment, applying the test signal comprises applying a pulse to a control signal. In one embodiment, the pulse causes a magnitude of a current to move toward zero. In one embodiment, determining whether the zero-speed test signal application criteria is satisfied comprises determining whether a signal indicating movement of a rotatable component is received from the encoder during a threshold period of time, determining whether a magnitude of a current remains above a calibration value for the threshold period of time, applying a first filter and a second filter to a control signal, and determining whether a difference between the first filtered control signal and the second filtered control signal remains below a threshold difference for the threshold period of time. In one embodiment, the control signal is a D-Axis voltage control signal and the current is a Q-Axis current. In one embodiment, selectively generating the signal indicating an encoder failure comprises generating the signal indicating an encoder failure when a signal indicating movement of a rotatable component is not received from the encoder during application of the test signal. In one embodiment, the test signal is a pulse applied to a Q-axis voltage control signal.

BRIEF DESCRIPTION OF THE SEVERAL VIEWS OF THE DRAWINGS

In the drawings, identical reference numbers identify similar elements or acts. The sizes and relative positions of elements in the drawings are not necessarily drawn to scale. For example, the shapes of various elements and angles are not drawn to scale, and some of these elements are arbitrarily enlarged and positioned to improve drawing legibility. Further, the particular shapes of the elements as drawn, are not intended to convey any information regarding the actual shape of the particular elements, and have been solely selected for ease of recognition in the drawings.

DETAILED DESCRIPTION OF THE INVENTION

In the following description, certain specific details are set forth in order to provide a thorough understanding of various embodiments. However, one skilled in the art will understand that the present systems and methods may be practiced without these details. In other instances, well-known structures associated with encoders, rotors, motors, controllers and/or circuitry have not been shown or described in detail to avoid unnecessarily obscuring descriptions of the embodiments.

Unless the context requires otherwise, throughout the specification and claims which follow, the word "comprise" and variations thereof, such as, "comprises" and "comprising" are to be construed in an open sense, that is as "including, but not limited to."

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

The headings provided herein are for convenience only and do not interpret the scope or meaning of the claimed invention.

Figure 1:
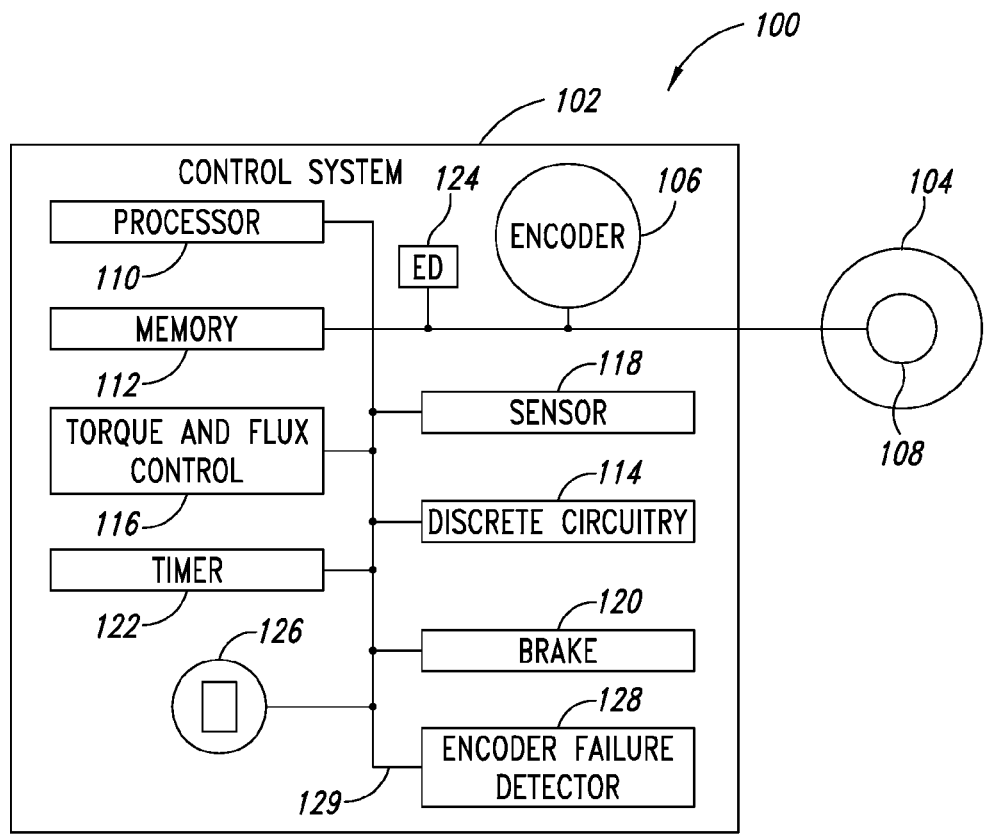
FIG. 1 is a schematic view of a portion of a control system incorporating an encoder and an electric machine according to one illustrated embodiment.

FIG. 1 illustrates a system 100 having a control system 102 coupled to a machine 104. The control system 102 has an increment encoder 106 for sensing a rotational speed or position of a shaft 108 in the machine 104. The increment encoder 106 may have, for example, two quadrant outputs (see FIG. 2). After reviewing the specification, one of skill in the art will recognize that an encoder having one or more output channels and/or multiple encoders may be employed. The control system 102 has a processor 110, a memory 112 and discrete circuitry 114, which may comprise, for example, one or more proportional and integral controllers, analog/digital converters, RC circuits or flip-flops. The control system 102 has a torque and flux control 116 for generating control signals, one or more sensors 118 for sensing conditions of the system 100, such as a temperature, a control signal, a feedback signal or a control setting. The sensor 118 may detect, for example, whether a parking brake 120 is set or a setting of a control signal generated by the torque and flux control 116. The control system 102 also comprises a timer 122, an encoder pulse detector, which as illustrated is an edge detector 124, and a keyed switch 126. The control system 102 also comprises an encoder failure detector 128. The components of the system 100 are communicatively coupled together by a bus system 129, which may comprise, for example, a power bus, a control bus, a data bus and a status signal bus. For the sake of clarity, however, the various system buses are illustrated in FIG. 1 as the bus system 129.

The torque and flux control 116, which may typically comprise one or more proportional and integral controllers, generates a D-axis voltage control signal, vd_pi. This control signal is typically combined with a D-axis feedback signal, vd_comp, to generate an overall D-axis voltage command, vd_mi. Similarly, a Q-axis voltage control signal vq_pi is typically combined with a Q-axis feedback signal vq_comp, to generate an overall Q-axis voltage command, vq_mi. The current commanded in the D-Axis is Id and the current commanded in the Q-Axis is Iq. As discussed in more detail below, the encoder failure detector 128 may use one or more of these signals, and/or filtered values of one or more of these signals or currents, to detect an encoder failure when a mechanical speed of the rotating component 108 is zero. For example, the behavior of the control signal vd_pi over time can serve as an indicator of whether an encoder 106 indicating a zero rotational speed has failed when the rotating component 108 is actually moving.

The control system 102 may be implemented in a variety of ways, including as separate subsystems. The control system 102 may be implemented as a digital signal processor (DSP), an application-specific integrated circuit (ASIC), or the like, or as a series of instructions stored in a memory, such as the memory 112, and executed by a processor, such as the processor 110. Thus, software modifications to existing hardware may allow the implementation of the control system 102. Various subsystems, such as the torque and flux control 116, the timer 122 and the encoder failure detector 128, are identified as separate blocks in the functional block diagram of FIG. 1 because they perform specific functions that will be described in more detail below. These subsystems may be discrete units. For example, the torque and flux control 116 may be implemented with one or more discrete circuits. These subsystems may not be discrete units but may be functions of a software routine, which will probably, but not necessarily, be separately callable and hence identifiable elements. Any suitable software or combinations of software may be used to implement the control system 102.

While the illustrated embodiment denotes a single processor 110, other embodiments may comprise multiple processors. The memory 112 may comprise, for example, registers, read only memory ("ROM"), random access memory ("RAM"), flash memory and/or electronically erasable read programmable read only memory ("EEPROM"), and may provide instructions and data for use by the control system 102.

Figure 2:
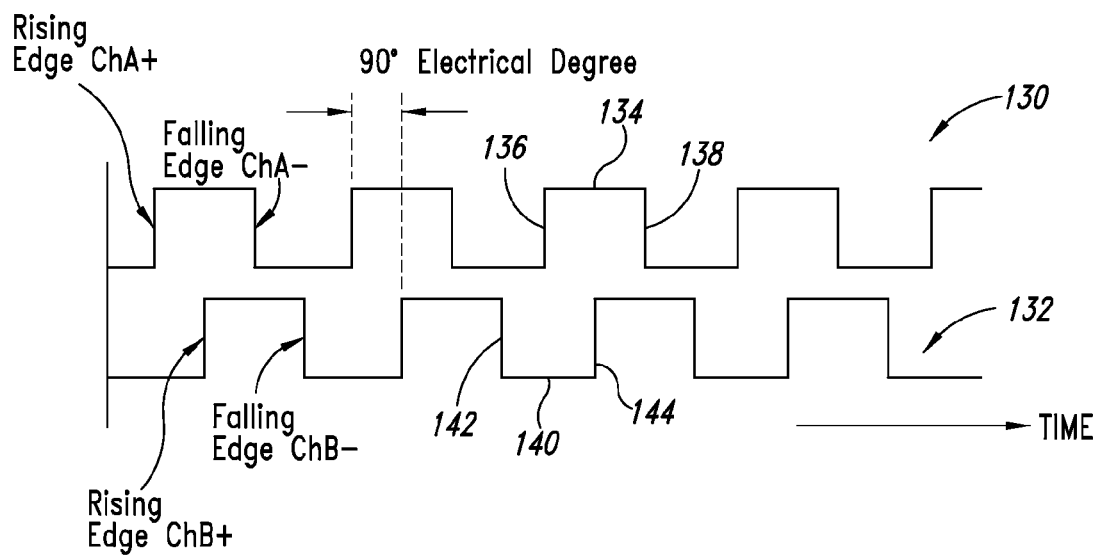
FIG. 2 is an example timing diagram illustrating operation of an embodiment of an encoder suitable for use in the embodiment of FIG. 1.

FIG. 2 is a timing diagram illustrating a pulse signal 130 of channel A and a pulse signal 132 of channel B of a two-channel increment encoder suitable for use in the embodiment of FIG. 1. These pulse signals 130,132 are usually phase-shifted from one another by ninety degrees. Pulse signal 130 of channel A comprises pulses 134, each of which has a rising edge 136 and a falling edge 138. Similarly, pulse signal 132 of channel B comprises pulses 140, each of which has a rising edge 142 and a falling edge 144.

The number of pulses in a channel (for example, pulses 134 of pulse signal 130 of channel A) corresponds to a rotational angle. At rotational speeds in a low speed range, the rotational speed of the shaft 108 is generally determined by measuring the time elapsed for a fixed number of pulses to be generated. At higher rotational speeds, the rotational speed is generally determined by counting the number of pulses in a fixed time period. See U.S. Pat. No. 6,246,343, which is incorporated in its entirety herein by reference. In conventional systems, encoder failure detection schemes follow the speed detection scheme used for a given speed range.

Rotational speeds below a certain minimum, however, cannot be accurately measured by conventional systems unless expensive, specialized devices are employed. In addition, encoder failure at zero rotational speed was previously thought to be unlikely with a high occurrence of false indications of failure expected. Thus, conventional encoder failure detection schemes are disabled at rotational speeds below a minimum rotational speed in conventional systems. The particular minimum rotational speed is application specific and depends on the type of machine and the rotational speeds at which it operates. For example, when the rotational speed of a shaft or rotor falls below 210 revolutions per minute in certain electric motor vehicles, encoder failure detection schemes are disabled in conventional systems. Thus, conventional encoder failure detection schemes do not detect a missing or disconnected encoder or an encoder that malfunctions below the minimum rotational speed. Conventional systems also are unable to detect a failed encoder at zero-speed.

Figure 3:
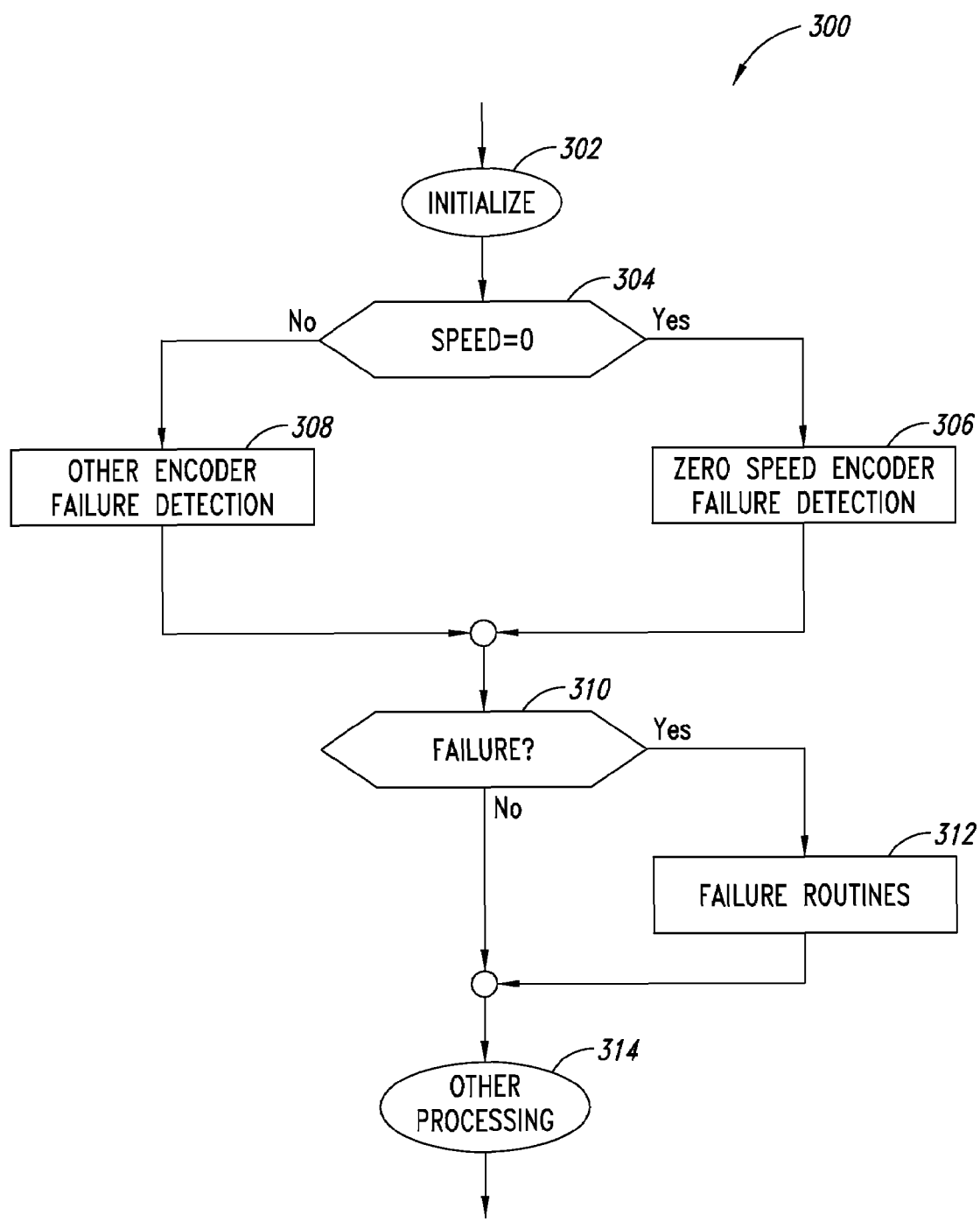
FIG. 3 is a high-level flow chart illustrating operation of an embodiment of a method for detecting an encoder failure.

FIG. 3 is a high-level flow chart illustrating an embodiment of a method for detecting a failed increment encoder in a system, such as the embodiment of a system 100 illustrated FIG. 1. For convenience, the method 300 will be described with respect to the embodiment of a system 100 illustrated in FIG. 1. The method 300 initializes at 302, during which the system 100 may, for example, set the initial values of variables and control signals. The method proceeds from 302 to 304. At 304, the system 100 determines whether one or more signals generated by the increment encoder 106 are consistent with no detected mechanical movement of a rotatable component of the system 100, such as the shaft 108. For example, the system 100 may determine whether the encoder 106 indicates a zero rotational speed for the shaft 108.

When the system 100 determines at 304 that no movement of a rotatable component has been detected by an encoder, the method 300 proceeds from 304 to 306. This may be done by, for example, determining whether an indicated mechanical speed is zero. The absence of a signal may serve as an indication that no mechanical movement has been detected. At 306, the system 100 performs zero-speed encoder failure detection methods, and in some embodiments may set or reset the values of variables and control signals. The zero-speed encoder failure detection methods may be performed, for example, by calling one or more subroutines. The method 300 proceeds from 306 to 310.

When the system 100 determines at 304 that the indicated speed is not zero, the method 300 proceeds from 304 to 308. At 308, the system 100 performs other encoder failure detection methods, and in some embodiments may set or reset the values of variables and control signals. These methods may include, for example, the methods discussed in co-pending U.S. patent application Ser. No. 10/903,492, entitled "Encoder Failure Detection," which is incorporated herein by reference in its entirety. The system 100 may perform these methods, for example, by calling one or more subroutines. The method 300 proceeds from 308 to 310.

At 310, the system 100 determines whether an encoder failure has been detected. This may be done, for example, by checking the value of one or more variables or flags that may have been set by one of the encoder failure detection methods. When it is determined at 310 that an encoder failure has been detected by the appropriate subroutine, the method 300 proceeds from 310 to 312. At 312, the system 100 executes encoder failure protocols or routines. The method 300 proceeds from 312 to 314. When it is determined that an encoder failure has not been detected, the method 300 proceeds from 310 to 314.

At 314, the system 100 may perform other functions, it may stop or it may return to 302. After reviewing the specification, one of skill in the art will recognize that embodiments of the system 100 may perform other acts not shown in FIG. 3, may not perform all of the acts shown in FIG. 3, or may perform the acts of FIG. 3 in a different order. For example, the system 100 may clear an encoder failure if a switch (such as keyed switch 126 of FIG. 1) is toggled. In another example, the method 300 may be modified to sequentially perform the various encoder failure detection methods. In another example, the method 300 may be modified to perform the various encoder failure detection methods simultaneously, for example, as separate threads. In another example, the method 300 may not separately check whether the encoder indicates a zero speed of a rotational component. Any desired conditions may be checked by a zero speed encoder failure detection subroutine, such as the method 400 described below with respect to FIG. 4.

Figure 4:
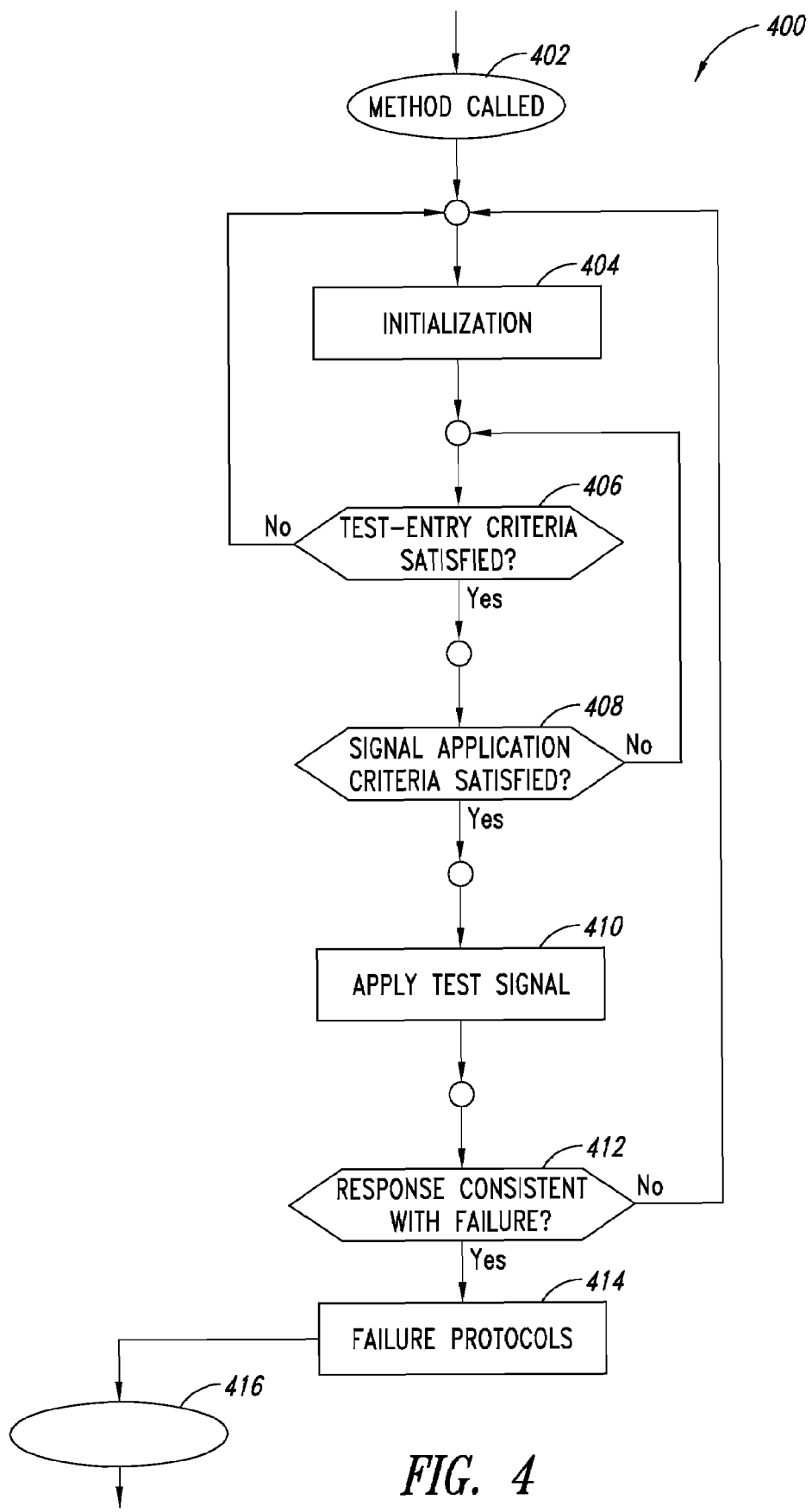
FIG. 4 is a high-level flow chart illustrating operation of an embodiment of a method of detecting an encoder failure.

FIG. 4 is a high-level flow diagram illustrating an embodiment of a zero speed encoder failure detection method 400. The embodiment of a method 400 illustrated in FIG. 4 is particularly well-suited for use as a continuous test loop, although it may be employed in other embodiments as well. The method 400 can be employed to detect a failed or missing encoder, such as the encoder 106 of FIG. 1, when a signal or the absence thereof is consistent with a zero speed, such as when the rotating component, such as shaft 108 of FIG. 1, has no rotational speed or no rotational speed has been measured by an encoder. For convenience, the method 400 will be described with respect to the system 100 illustrated in FIG. 1.

At 402 the method 400 is called and proceeds to 404. Initialization occurs at 404, where the system 100 may, for example, set or reset testing loop control variables, flags and other variables. The method 400 proceeds from 404 to 406.

At 406, the system 100 determines whether a zero-speed test entry criteria is satisfied. The zero-speed test entry criteria may include, for example, whether the speed indicated by an encoder is zero and whether an absolute value of a torque current is above a threshold. When the system 100 determines at 406 that the zero-speed test entry criteria is not satisfied, the method 400 proceeds from 406 to 404. When the system 100 determines at 406 that the zero-speed test entry criteria is satisfied, the method 400 proceeds from 406 to 408.

At 408, the system 100 determines whether a zero-speed test signal application criteria is satisfied. The zero-speed test signal application criteria may include, for example, the absence of an indication of mechanical movement for a threshold period of time. In another example, the zero-speed test signal application criteria may also include control signals or changes in control signals remaining within threshold ranges for a threshold period of time, which may be the same threshold period of time or different threshold periods of time. Determining whether the zero-speed test signal application criteria is satisfied may be done, for example, by using a timer or a counter that is reset when the conditions are not satisfied and decremented when conditions are satisfied. In one example embodiment, the zero-speed test signal application criteria may comprise whether the absolute value of a difference between a slow-filtered value of a control signal and a fast-filtered value of the control signal remains below a threshold calibration value for the threshold period of time. In one example embodiment, the zero-speed test signal application criteria may comprise whether the absolute value of a difference between a slow-filtered value of the control signal and a fast-filtered value of the control signal is below a threshold calibration value at the conclusion of the threshold period of time. In some embodiments, the control signal may be a D-Axis voltage control signal or a component thereof. In some embodiments, the control signal may comprise a torque current control signal.

An embodiment where the current is a commanded torque current and the control signal is a D-axis voltage control signal may be used in, for example, high performance induction motor or synchronous permanent magnet motor drives.

An embodiment where the current is a torque current and the control signal is a D-axis voltage control signal may be used in, for example, high performance induction motor or synchronous permanent magnet motor drives.

An embodiment where the control signal is a D-Axis voltage control signal and the current is a Q-Axis current may be used in, for example, induction motor or synchronous permanent magnet motor drives.

In some embodiments, the zero-speed test signal application criteria may comprise the zero-speed test entry criteria. The threshold period of time may be selected based on the characteristics of the system 100 and may be selected so as to minimize false positive indications of an encoder failure. In one example embodiment, the threshold period of time is 400 ms. When the system 100 determines at 408 that zero-speed test signal application criteria is not satisfied, the method 400 proceeds from 408 to 406. When the system 100 determines at 408 that the zero-speed test signal application criteria is satisfied, the method 400 proceeds from 408 to 410.

At 410, the system 100 applies a test signal. The test signal may be selected so as to minimize the impact on the operation of the system 100, while at the same time generating information that can be analyzed to determine whether an encoder has likely failed. The test signal may comprise, for example, a pulse applied to a torque control signal generated by the system 100. The pulse may be, for example, a pulse applied to so as to move Iq toward zero, for a threshold period of time. The pulse may be, for example, a positive pulse or a negative pulse. In one embodiment, the test signal is applied for a threshold period of time of, for example, 50 ms, and is, for example, a negative pulse with a magnitude between approximately 20% and 50% of a magnitude of an applied torque control signal. In one embodiment, the test signal is a pulse applied to a Q-axis voltage control signal and may be used in, for example, induction motor or synchronous permanent magnet motor drives. The method 400 proceeds from 410 to 412.

At 412, the system 100 determines whether a response to the application of the test signal is consistent with an encoder failure. This may be done, for example, by determining whether a response to the test signal satisfies a failure criteria. In some embodiments, the failure criteria is satisfied if the zero-speed test signal application criteria remains satisfied for a duration of the test signal. When the system 100 determines at 412 that the response is not consistent with an encoder failure, the method 400 proceeds from 412 to 404. When the system 100 determines at 412 that the response is consistent with an encoder failure, the method 400 proceeds from 412 to 414.

At 414, the system 100 executes zero-speed encoder failure protocols. These may include, for example, setting an encoder failure flag or other variables or signals and disabling or limiting the operation of the system 100. The method 400 proceeds from 414 to 416, where it may perform other processing.

After reviewing the specification, one of skill in the art will recognize that embodiments of the system 100 may perform other acts not shown in FIG. 4, may not perform all of the acts shown in FIG. 4, or may perform the acts of FIG. 4 in a different order. For example, the system 100 may clear an encoder failure if a switch (such as keyed switch 126 of FIG. 1) is toggled. In another example, the method 400 may be modified to check other system conditions before applying the test signal. In another example, the method 400 may be modified to temporarily disable other encoder failure detection methods while the test signal is applied. In another example, the method 400 may be modified to include a delay after initialization of the system 100. In another example, the method 400 may be modified to include initializing some variables before proceeding to 404. In other words, some variables may be initialized outside of the 404-406/404-412 loops. In another example, the method 400 may be modified to reset initial variables and proceed from 406 to 416 when it is determined at 406 that the zero-speed test entry criteria is not satisfied.

Figure 5:
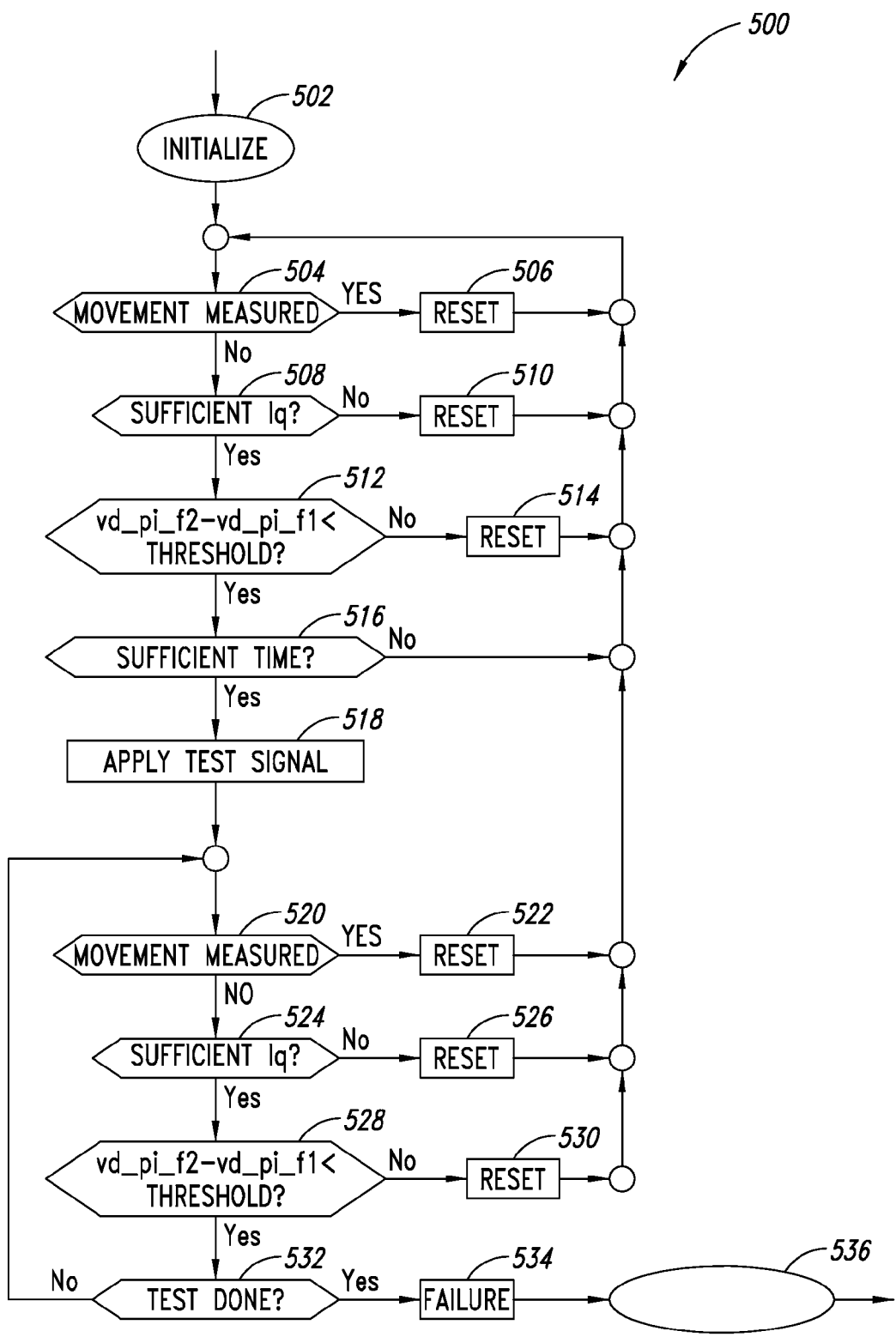
FIG. 5 is a mid-level flow chart illustrating operation of an embodiment of a method of detecting an encoder failure.

FIG. 5 is a mid-level flow diagram illustrating an embodiment of a zero speed encoder failure detection method 500. The embodiment of a method 500 illustrated in FIG. 5 is particularly well-suited for use as a continuous test loop, although it may be employed in other embodiments as well. The method 500 can be employed to detect a failed or missing encoder, such as the encoder 106 of FIG. 1, when a signal or the absence thereof is consistent with a zero speed, such as when the rotating component, such as shaft 108 of FIG. 1, has no rotational speed or no rotational speed has been measured by an encoder. For convenience, the method 500 will be described with respect to the system 100 illustrated in FIG. 1.

At 502 the method 500 is initialized, where the system 100 may, for example, set or reset testing loop timers, control variables, flags and other variables. For example, an zero-speed condition test loop timer may be set to, for example, 400 ms. The method 500 proceeds from 502 to 504.

At 504, the system 100 determines whether movement of the rotatable component has been measured by the encoder. For example, the system 100 may determine whether a measured speed, for example, a measured revolutions-per-minute (RPM), for a rotatable component is zero. In another example, the system 100 may determine whether it is receiving any pulses from an encoder, such as the encoder 106 of FIG. 1. When the system 100 determines at 504 that movement of the rotatable component has been detected, the method 500 proceeds from 504 to 506. At 506, the system 100 resets any variables as appropriate, such as the zero-speed condition test loop timer referenced above, and the method proceeds from 506 to 504. When the system 100 determines at 504 that movement has not been detected, the method proceeds from 504 to 508.

At 508, the system 100 determines whether Iq is of a sufficient magnitude. This may be done, for example, by comparing the absolute value of the Q-axis current, Iq, to a calibration or threshold value. This threshold value may vary based on the characteristics of the machine and the conditions of use. When the system 100 determines at 508 that Iq is not of a sufficient magnitude, the method 500 proceeds from 508 to 510. At 510, the system 100 resets any variables as appropriate, such as the zero-speed condition test loop timer referenced above, and the method proceeds from 510 to 504. When the system 100 determines at 508 that Iq is of a sufficient magnitude, the method proceeds from 508 to 512.

At 512, the system 100 determines whether the difference between a slow-filter voltage control signal, vd_pi_f2, and a normal voltage control signal, vd_pi_f1, is less than a threshold value. The normal value vd_pi_f1 represents a normal value for vd_pi for which no rotational movement of the rotatable component is expected. The normal Id controller output, vd_pi_f1, may be pre-determined for a particular system or use of a system, or it may be a captured value. A look-up table may be employed to determine the normal value vd_pi_f1 for particular system configurations and operating conditions. The normal value, vd_pi_f1, may be captured, for example, when certain conditions are satisfied, so that the captured value may be used for testing subsequent to those conditions. For example, a fast filter can be applied by the system 100 to a vd_pi signal when the system is initialized and a zero Iq commanded. In another example, a fast filter can be applied to a vd_pi signal when the speed is zero and a reference Iq value is zero. For example, a filter with a 10 ms time-constant may be employed to capture the value of vd_pi_f1. The current value of vd_pi, vd_pi_f2, may be determined, for example, by applying a slow filter to the vd_pi signal, such as a filter with a 200 ms time-constant. This threshold value and time constants may vary based on the characteristics of the machine and the conditions of use. Additional examples are discussed in more detail below in the description of FIGS. 6a, 6b and 7. When the system 100 determines at 512 that the difference between vd_pi_f2 and vd_pi_f1 is not less the threshold value, the method 500 proceeds from 512 to 514. At 514, the system 100 resets any variables as appropriate, such as the zero-speed condition test loop timer referenced above, and the method proceeds from 514 to 504. When the system 100 determines at 512 that the difference between vd_pi_f2 and vd_pi_f1 is less than the threshold value, the method 500 proceeds from 512 to 516.

At 516, the system 100 determines whether the zero-speed test signal application criteria have been satisfied for a sufficient period of time. This may be done, for example, by determining whether a timer has expired or a counter has reached a threshold value. When the system 100 determines at 516 that the zero-speed test signal application criteria have not been satisfied for a sufficient period of time, the method 500 proceeds from 516 to 504. When the system 100 determines at 516 that the zero-speed test signal application criteria have been satisfied for a sufficient period of time, the method proceeds from 516 to 518.

At 518, the system 100 applies a test signal. The test signal can be selected so as to minimize the impact on the system 100, while at the same time generating a response that can be used to determine whether an encoder has failed or is missing. In one embodiment, the test signal is a pulse with a magnitude sufficient to reduce a magnitude of the Q-Axis current, Iq, by approximately 20% to 50%. The system 100 may also set a timer or loop control counter at 518, such as a test application timer. For example, the system 100 may set a timer so that the test signal is applied for a duration of, for example, 50 ms. The method 500 proceeds from 518 to 520.

At 520, the system 100 determines whether a movement of the rotatable component has been detected or measured. This may be done, for example, by determining whether the system 100 is receiving or received any pulses from an encoder, such as the encoder 106 of FIG. 1. When the system 100 determines at 520 that a movement of the rotatable component has been measured, the method 500 proceeds from 520 to 522. At 522, the system 100 resets any variables as appropriate, such as the zero-speed condition test loop timer and the test application timer referenced above, and may discontinue the test signal. The method proceeds from 522 to 504. When the system 100 determines at 520 that the measured speed is zero or no movement is measured, the method proceeds from 520 to 524.

At 524, the system 100 determines whether Iq is of a sufficient magnitude. This may be done, for example, by comparing the absolute value of the torque current control signal to a calibration or threshold value. This threshold value may vary based on the characteristics of the machine and the conditions of use. When the system 100 determines at 524 that Iq is not of a sufficient magnitude, the method 500 proceeds from 524 to 526. At 526, the system 100 resets any variables as appropriate, such as the zero-speed condition test loop timer and the test application timer referenced above, and may discontinue the test signal. The method proceeds from 526 to 504. When the system 100 determines at 524 that Iq is of a sufficient magnitude, the method proceeds from 524 to 528.

At 528, the system 100 determines whether the difference between a slow-filter voltage control signal, vd_pi_f2, and a normal voltage control signal, vd_pi_f1, is less than a threshold value. This may be done, for example, as discussed above with respect to act 512. When the system 100 determines at 528 that the difference between vd_pi_f2 and vd_pi_f1 is not less the threshold value, the method 500 proceeds from 528 to 530. At 530, the system 100 resets any variables as appropriate, such as the zero-speed condition test loop timer and the test application timer referenced above, and may discontinue the test signal. The method proceeds from 530 to 504. When the system 100 determines at 528 that the difference between vd_pi_f2 and vd_pi_f1 is less than the threshold value, the method 500 proceeds from 528 to 532.

At 532, the system 100 determines whether the test is complete. This may be done, for example, by determining whether the test signal has been applied for a sufficient period of time. The system 100 may, for example, determining whether a timer has expired or a counter has reached a threshold value. When the system 100 determines at 532 that the test is not complete, the system proceeds from 532 to 520. When the system 100 determines at 532 that the test is complete, the method 500 proceeds from 532 to 534. At 534, the system 100 generates a signal to indicate an encoder failure. This may be done, for example, by setting a flag. The method 500 proceeds from 534 to 536, where the system 100 may perform other processing, such as generating control signals to address the indication of a failed encoder.

After reviewing the specification, one of skill in the art will recognize that embodiments of the system 100 may perform other acts not shown in FIG. 5, may not perform all of the acts shown in FIG. 5, or may perform the acts of FIG. 5 in a different order. For example, the system 100 may clear an encoder failure if a switch (such as keyed switch 126 of FIG. 1) is toggled. In another example, the method 500 may be modified to check other system conditions before applying the test signal. In another example, the method 500 may be modified to temporarily disable other encoder failure detection methods while the test signal is applied. In another example, the method 500 may be modified to include a delay after initialization of the system 100.

Figure 6A:
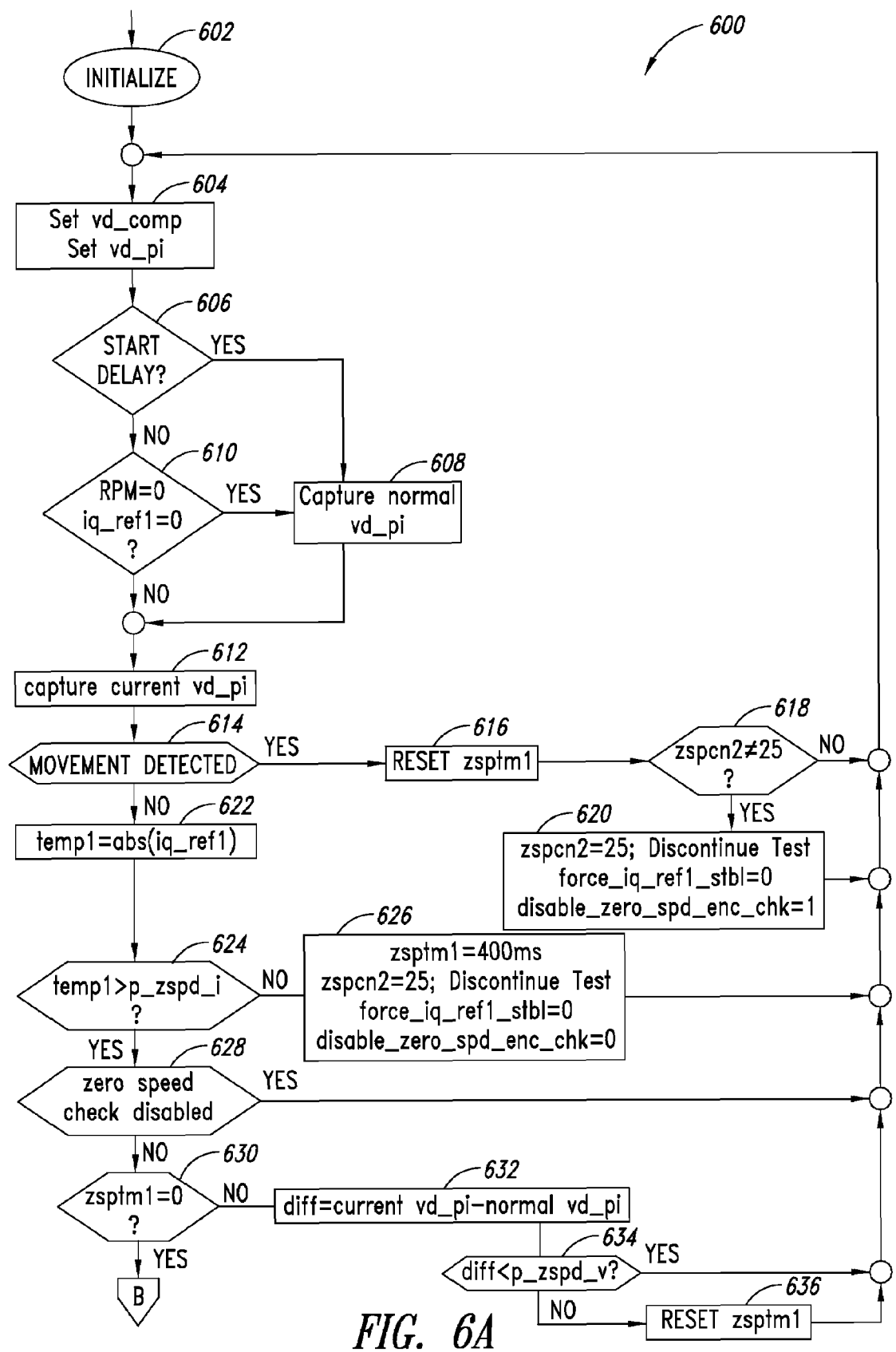
FIGS. 6a-6b are a mid-level flow chart illustrating operation of an embodiment of a method of detecting an encoder failure.
Figure 6B:
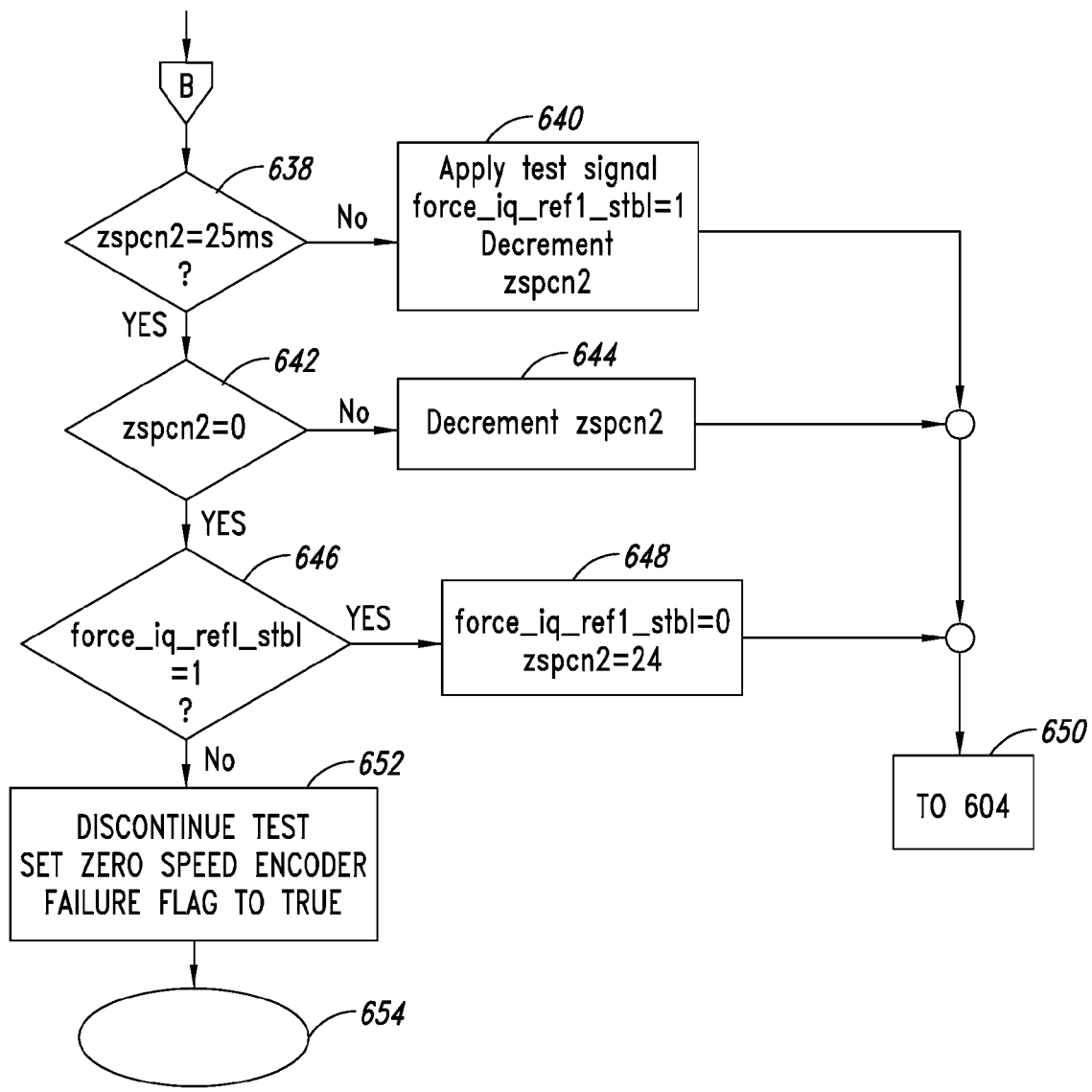

FIGS. 6a and 6b are a mid-level flow diagram illustrating an embodiment of a zero speed encoder failure detection method 600. This embodiment may, for example, be employed in combination with the embodiment illustrated in FIG. 7. The embodiment of a method 600 illustrated in FIG. 6 is particularly well-suited for use as a continuous test loop, although it may be employed in other embodiments as well. The method 600 can be employed to detect a failed or missing encoder, such as the encoder 106 of FIG. 1, when a signal or the absence thereof is consistent with a zero speed, such as when the rotating component, such as shaft 108 of FIG. 1, has no rotational speed or no rotational speed has been measured by an encoder. For convenience, the method 600 will be described with respect to the system 100 illustrated in FIG. 1.

At 602 the method 600 is initialized, where the system 100 may, for example, set or reset testing loop timers, control variables, flags and other variables. For example, the following flags and variables may be set: a first timer, zsptm1, to 400 ms; a first counter, zspcn2, to 25; a flag for forcing a Q-axis current reference to a stable value, force_iq_ref1_stbl, to zero (or false); vd_pi to zero; a variable for storing a captured or a fast-filtered value for vd_pi, vd_pi_f1, to zero; a variable for a slow-filtered value for vd_pi, vd_pi—f2, to zero; and a flag for disabling the checking of whether an encoder has failed at zero speed, disable_zero_spd_enc_chk, to zero (or false). Different, fewer or additional variables and flags may be set by the system 100 when it initializes. In the illustrated embodiment, the first timer zsptm1 may run continuously. Counters may be used instead of or in combination with the timers and vice-versa. The method 600 proceeds from 602 to 604.

At 604, the system 100 determines and/or retrieves the values for vd_comp and vd_pi in a conventional manner. The method 600 proceeds from 604 to 606. At 606, the system 100 determines whether a system start-up delay is in progress. This may be determined by checking a counter or timer used to cause a delay in commanding a torque current for a threshold period of time after the system 100 is initialized. See the description of FIG. 7, below.

When the system 100 determines at 606 that a start-up delay is in progress, the method 600 proceeds from 606 to 608. At 608, the system 100 captures a normal value for a zero-speed vd_pi, vd_pi_f1. This may be done, for example, by applying a fast filter to the vd_pi signal, such as a filter with a time constant of 10 ms. The time constant of the filter may be selected based on characteristics of the system 100 and may be selected so as to minimize false indications of an encoder failure. The method 600 proceeds from 608 to 612.

Figure 7:
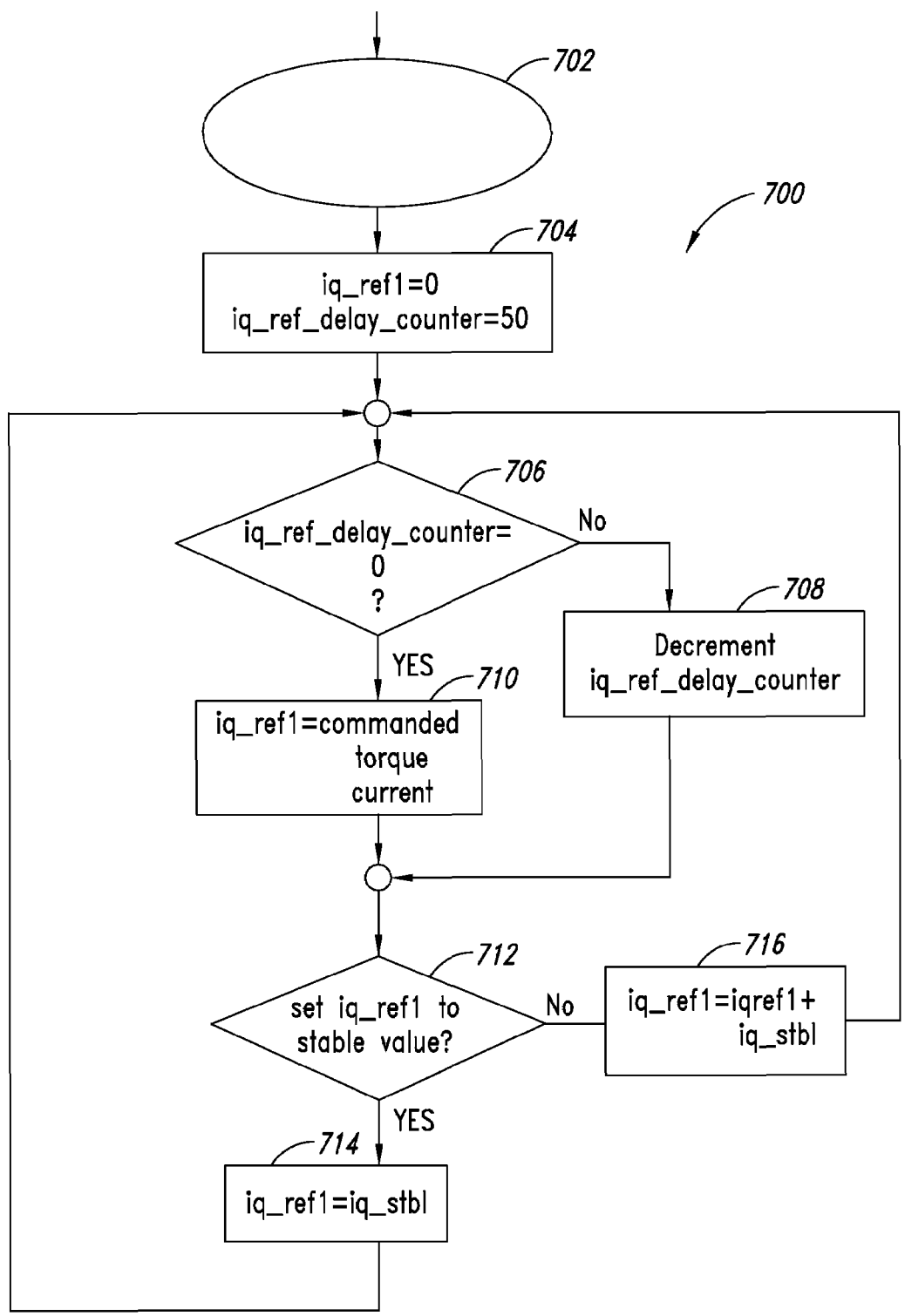
FIG. 7 is a high-level flow chart illustrating an embodiment of a method of forcing a current reference to a stable value that can be employed in embodiments of a method of detecting an encoder failure.

When the system 100 determines at 606 that a start-up delay is not in progress, the method 600 proceeds from 606 to 610. At 610, the system 100 determines whether a mechanical movement of the rotatable component is detected by an encoder (for example, whether a measured revolutions per minute from an encoder is zero) and whether a reference commanded torque, iq_ref1, is zero. FIG. 7 illustrates an example method for setting the reference commanded torque iq_ref1. When the system determines at 610 that mechanical movement is not detected and that the reference commanded torque, iq_ref1, is zero, the method 600 proceeds from 610 to 608. When the system 100 determines at 610 that either mechanical movement is detected or that the reference commanded torque iq_ref1 is not zero, the method 600 proceeds from 610 to 612.

At 612, the system 100 determines a current value for vd_pi, vd_pi_f2. This may be done, for example, by applying a slow filter to the vd_pi signal. For example, a filter with a time constant of 200 ms may be employed. The time constant of the filter may be selected based on characteristics of the system 100 and may be selected so as to minimize false indications of an encoder failure. The method 600 proceeds from 612 to 614.

At 614, the system 100 determines whether movement of the rotatable component is being detected by the encoder. This may be done, for example, by determining whether a measured RPM is zero or a pulse has been received from an encoder. When the system 100 determines that a movement has been detected by the encoder, the system proceeds from 614 to 616. At 616, the system 100 resets the first timer zsptm1. For example, the first timer may be reset to 400 ms. The method 600 proceeds from 616 to 618. At 618, the system 100 determines whether a test signal is being applied. As illustrated, this may be done, for example, by determining whether the first counter zspcn2 is not set to 25. When the system 100 determines at 618 that a test signal is not being applied, the method 600 proceeds from 618 to 604.

When the system 100 determines at 618 that a test signal is being applied, the method 600 proceeds from 618 to 620. As discussed below, in the illustrated embodiment the first counter zspcn2 is decremented when a test signal is applied. Thus, any value other than 25 is an indication that a test signal is being applied during the test cycle. At 620, the system 100 resets the first counter to 25, discontinues the test signal, resets the flag for forcing the current reference iq_ref1 to zero, force_iq_ref1_stbl, to zero (or false), and sets a flag for disabling the checking of whether an encoder has failed at zero speed, disable_zero_spd_enc_chk, to one (or True). Setting the flag to disable the checking of whether an encoder has failed at zero speed prevents the system 100 from indicating a failure of the encoder based on a zero-speed test until the magnitude of the torque current commanded is less than a calibration value. The method 600 proceeds from 620 to 604.

When the system 100 determines at 614 that movement of the rotatable component is not being detected, the method 600 proceeds from 614 to 622. At 622, the system 100 determines a current absolute value for the current reference, iq_ref1, which as illustrated is the variable temp1. A filter may be applied to iq_ref1, with a time constant selected, for example, to minimize false positive indications of encoder failure. The method 600 proceeds from 622 to 624.

At 624, the system 100 determines whether the magnitude of the torque current reference exceeds a threshold calibration value, p_zspd_i. As illustrated, this is done by comparing the variable temp1 to the calibration value. The calibration value selected may depend on the characteristics and operating conditions of the system 100 and may be selected, for example, to minimize false positive indications of an encoder failure. A look up table may be employed to select the calibration value. When the system 100 determines at 624 that the magnitude of the torque reference current iq_ref1 does not exceed the calibration value, the method 600 proceeds from 624 to 626. At 626, the system 100 resets the timer zsptm1, the counter zspcn2, and the flags force_iq_ref1_stbl and disable_zero_spd_enc_chk, and discontinues any test signal that is being applied. The method 600 proceeds from 626 to 604. When the system 100 determines at 624 that the magnitude of the torque reference current iq_ref1 exceeds the calibration value, the method 600 proceeds from 624 to 628.

At 628, the system 100 determines whether the zero-speed encoder failure check is temporarily disabled. This may be done, for example, by checking the flag disable_zero_spd_enc_chk. When the system 100 determines that the zero-speed encoder check is temporarily disabled, the method 600 proceeds from 628 to 604. When the system 100 determines that the zero-speed encoder check is not disabled, the method 600 proceeds from 628 to 630.

At 630, the system 100 determines whether the test signal application criteria have been satisfied for a sufficient period of time. As illustrated, this is done by determining whether the timer zsptm1 has expired. When the system 100 determines at 630 that the test signal application criteria have not been satisfied for a sufficient period of time, the method 600 proceeds from 630 to 632. At 632, the system 100 determines the difference between the current vd_pi and the normal vd_pi, which may be determined by subtracting the captured normal vd_pi, vd_pi_f1 from the captured current vd_pi, vd_pi_f2. The method proceeds from 632 to 634. At 634, the system 100 determines whether the difference between the current vd_pi and the normal vd_pi is less than a calibration value, p_zspd_v. The calibration value may be selected, for example, to minimize false positive indications of an encoder failure. A look up table may be employed to select the calibration value. When the system 100 determines at 634 that the difference between the current vd_pi and the normal vd_pi is less than the calibration value, the method proceeds from 634 to 604. When the system 100 determines at 634 that the difference between the current vd_pi and the normal vd_pi is not less than the calibration value, the method proceeds from 634 to 636. At 636, the system 100 resets the first timer, zsptm1. The method 600 proceeds from 636 to 604.

When the system 100 determines at 630 that the test signal application criteria have been satisfied for a sufficient period of time, the method 600 proceeds from 630 to 638. At 638, the system 100 determines whether a test signal is already being applied. As illustrated, this is done by comparing a counter, zspcn2, to its reset value, 25. Flags, counters, timers, and other means may be employed by the system 100 to determine whether a test signal is already being applied. When the system 100 determines at 638 that a test signal is not being applied, the method 600 proceeds from 638 to 640. At 640, the system 100 applies the test signal, decrements the counter zpscn2, and sets the flag to force the current reference iq_ref1 to a stable commanded torque reference value, iq_stbl. The method 600 proceeds from 640 to 650, and returns to 604. When the system 100 determines at 638 that a test signal is being applied, the method 600 proceeds from 638 to 642.

At 642, the system 100 determines whether the counter zspcn2 has reached zero. When the system 100 determines that the counter zspcn2 has not reached zero, the method 600 proceeds from 642 to 644. At 644, the system 100 decrements the counter zspcn2. The method 600 proceeds from 644 to 650, and returns to 604. When the system 100 determines that the counter zspcn2 has reached zero, the method 600 proceeds from 642 to 646.

At 646, the system 100 determines whether the flag to force the current reference iq_ref1 to a stable value is set. When the system 100 determines at 646 that the flag to force the reference current iq_ref1 to a stable value is set to one (True), the method 600 proceeds from 646 to 648. At 648, the system 100 resets the flag to force the reference current iq_ref1 to a stable value to zero (False), and sets the counter zspcn2 to 24. The method 600 proceeds from 648 to 650, and returns to 604.

When the system 100 determines at 646 that the flag to force the reference current iq_ref1 to a stable value is not set to one (False), the method 600 proceeds from 646 to 652. At 652, the system 100 discontinues the test signal and sets a flag to indicate a zero-speed encoder failure has been detected. The method proceeds from 652 to 654, where other processing, such as error routines, may be performed.

After reviewing the specification, one of skill in the art will recognize that embodiments of the system 100 may perform other acts not shown in FIGS. 6a and 6b, may not perform all of the acts shown in FIGS. 6a and 6b, or may perform the acts of FIGS. 6a and 6b in a different order. For example, variables may be employed instead of flags. In another example, the method 600 may be modified to check whether the difference between the current vd_pi and the normal vd_pi is less than a threshold value before checking whether the conditions for applying a test signal have been satisfied for a sufficient period of time.

FIG. 7 illustrates an embodiment of a method 700 of forcing a torque current reference to a zero or to a stable value that may be employed in an embodiment of a method of detecting an encoder failure. For convenience, the method 700 will be described with respect to the system 100 illustrated in FIG. 1. The method 700 begins at 702 and proceeds to 704. At 704, the system sets a reference value for a commanded current to zero and a delay counter, iq_ref_delay_counter to a desired delay interval, which as illustrated is 50. The initial value of the counter may vary based on the characteristics of the system 100, and may be selected so as to minimize false positive indications of an encoder failure. The method 700 proceeds from 704 to 706.

At 706, the system 100 determines whether the counter has expired. When the system 100 determines that the counter has not expired, the method 700 proceeds from 706 to 708. At 708, the system 100 decrements the delay counter, iq_ref_delay_counter. The method proceeds from 708 to 712. When the system 100 determines that the counter has expired, the method proceeds from 706 to 710.

At 710, the system 100 sets the value of the torque current reference, iq_ref1, to a commanded torque current level in a conventional manner. The torque current reference may be a function of an input command or throttle setting or a value stored in a memory, or combinations thereof. The system 100 may employ a lookup table to set the commanded torque level. The method 700 proceeds from 710 to 712.

At 712, the system 100 determines whether a flag has been set to force iq_ref to a stable value. When the system 100 determines that the flag is set, the method proceeds from 712 to 714. At 714, the system 100 sets the value of iq_ref1 to iq_stbl. The method 700 proceeds from 714 to 706. When the system 100 determines that the flag is not set, the method 700 proceeds from 712 to 716. At 716, the system 100 sets iq_ref1 to iq_ref1+iq_stbl in a conventional manner. The method proceeds from 716 to 706.

Although specific embodiments of and examples for a control system and method are described herein for illustrative purposes, various equivalent modifications can be made without departing from the spirit and scope of the invention, as will be recognized by those skilled in the relevant art. The teachings provided herein can be applied to other systems with increment encoders, not necessarily the machines and motor vehicles described above.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet, including but not limited to commonly assigned U.S. Pat. No. 6,246,343 and commonly assigned U.S. patent application Ser. No. 10/903,492, are incorporated herein by reference, in their entirety. Aspects of the invention can be modified, if necessary, to employ systems, circuits and concepts of the various patents, applications and publications to provide yet further embodiments of the invention.

These and other changes can be made to the invention in light of the above-detailed description. In general, in the following claims, the terms used should not be construed to limit the invention to the specific embodiments disclosed in the specification and the claims, but should be construed to include all control systems incorporating increment encoders. Accordingly, the invention is not limited by the disclosure, but instead its scope is to be determined entirely by the following claims.

The invention claimed is:

1. A machine comprising:
   a rotatable component; and
   a control system, the control system comprising:
      an encoder configured to generate a signal in response to rotational movement of the rotatable component and coupled to the rotatable component;
      a torque and flux control configured to generate a control signal to control the rotatable component; and
      an encoder failure detector configured to:
         monitor the signal generated by the encoder;
         monitor the control signal;
         monitor a current;
         selectively apply a test signal when the monitoring satisfies a zero-speed test signal application criteria; and
         selectively generate an encoder failure signal based on a response to the application of the test signal.

2. The machine of claim 1 wherein the encoder is configured to generate a pulse in response to a movement of the rotatable component.

3. The machine of claim 1 wherein the test signal is a pulse applied to the control signal.

4. The machine of claim 1 wherein the test signal is a pulse causing a magnitude of the monitored current to move toward zero.

5. The machine of claim 1 wherein the zero-speed test signal application criteria comprise:
   the signal generated by the encoder remaining consistent with no measured rotational movement of the rotatable component for a threshold period of time; and
   an absolute value of the monitored current remaining above a calibration value for the threshold period of time.

6. The machine of claim 5 wherein the encoder failure detector is further configured to:
apply a first filter and a second filter to the control signal; and the zero-speed test signal application criteria further comprise a difference between the first filtered control signal and the second filtered control signal remaining below a threshold difference value for the threshold period of time.

7. The machine of claim 5 wherein the encoder failure detector is further configured to:
apply a first filter and a second filter to the control signal; and the zero-speed test signal application criteria further comprise a difference between the first filtered control signal and the second filtered control signal being below a threshold difference value after the threshold period of time has elapsed.

8. The machine of claim 1 wherein the encoder failure detector is configured to selectively generate the encoder failure signal when the signal generated by the encoder remains consistent with no rotational movement of the rotatable component for a duration of the test signal.

9. The machine of claim 1 wherein the encoder failure detector is configured to generate the encoder failure signal when the zero-speed test signal application criteria remain satisfied for a duration of the test signal.

10. A method of detecting a failure of an increment encoder in a machine, the method comprising:
determining whether a zero-speed test signal application criteria is satisfied; and
when the zero-speed test signal application criteria is satisfied:
applying a test signal;
measuring a response to the test signal, wherein measuring the response to the test signal comprises counting a number of pulses in an encoder channel output; and
selectively generating a signal indicating an encoder failure based on the measured response to the test signal, wherein applying the test signal comprises applying a pulse to cause a magnitude of a current to move toward zero.

11. A method of detecting a failure of an increment encoder in a machine, the method comprising:
determining whether a zero-speed test signal application criteria is satisfied; and
when the zero-speed test signal application criteria is satisfied:
applying a test signal;
measuring a response to the test signal wherein measuring the response to the test signal comprises determining whether the zero-speed test signal application criteria remain satisfied during the application of the test signal; and
selectively generating a signal indicating an encoder failure based on the measured response to the test signal and selectively generating the signal indicating an encoder failure comprises generating the signal indicating an encoder failure when it is determined that the zero-speed test signal application criteria remained satisfied during the application of the test signal.

12. A method of detecting a failure of an increment encoder in machine, the method comprising:
determining whether a zero-speed test signal application criteria is satisfied; and
when the zero-speed test signal application criteria is satisfied:
applying a test signal wherein applying the test signal comprises applying a pulse to a control signal;
measuring a response to the test signal; and
selectively generating a signal indicating an encoder failure based on the measured response to the test signal.

13. The method of claim 12 wherein the pulse causes a magnitude of a current to move toward zero.

14. A method of detecting a failure of an increment encoder in a machine, the method comprising:
determining whether a zero-speed test signal application criteria is satisfied wherein determining whether the zero-speed test signal application criteria is satisfied comprises:
determining whether a signal indicating movement of a rotatable component is received from the encoder during a threshold period of time;
determining whether a magnitude of a current remains above a calibration value for the threshold period of time; and
when the zero-speed test signal application criteria is satisfied:
applying a test signal;
measuring a response to the test signal, wherein measuring the response to the test signal comprises counting a number of pulses in an encoder channel output; and
selectively generating a signal indicating an encoder failure based on the measured response to the test signal.

15. The method of claim 14 wherein determining whether the zero-speed test signal application criteria is satisfied further comprises:
applying a first filter and a second filter to a control signal; and
determining whether a difference between the first filtered control signal and the second filtered control signal remains below a threshold difference value for the threshold period of time.

16. The method of claim 15 wherein the current is commanded torque current and the control signal is a D-axis voltage control signal.

17. The method of claim 14 wherein determining whether the zero-speed test signal application criteria is satisfied further comprises:
applying a first filter and a second filter to a control signal; and
determining whether a difference between the first filtered control signal and the second filtered control signal is below a threshold difference value after the threshold period of time has elapsed.

18. A method of detecting a failure of an increment encoder in a machine, the method comprising:
determining whether a zero-speed test signal application criteria is satisfied: and
when the zero-speed test signal application criteria is satisfied:
applying a test signal;
measuring a response to the test signal, wherein measuring the response to the test signal comprises counting a number of pulses in an encoder channel output; and
selectively generating a signal indicating an encoder failure based on the measured response to the test signal, wherein selectively generating the signal indicating an encoder failure comprises generating the signal indicating an encoder failure when a signal indication movement of a rotatable component is not received from the encoder during application of the test signal.

19. A control system comprising:
means for detecting movement of a rotatable component;
means for controlling movement of the rotatable component; and
means for detecting a failure of the means for detecting movement of the rotatable component, coupled to the means for detecting movement of the rotatable component and to the means for controlling movement of the rotatable component, wherein the means for detecting a failure of the means for detecting movement of the rotatable component selectively applies a test signal when a zero-speed test signal application criteria is satisfied; and selectively generates an encoder failure signal based on a response to the test signal.

20. The control system of claim 19 wherein:
the means for detecting movement of the rotatable component comprises an encoder configured to generate a signal in response to a rotational movement of the rotatable component;
the means for controlling movement of the rotatable component comprises a torque and flux control configured to generate a control signal; and
the means for detecting a failure of the means for detecting movement of the rotatable component comprises an encoder failure detector configured to:
monitor the signal generated by the encoder;
monitor the control signal;
monitor a current;
selectively apply the test signal when the monitoring satisfies the zero-speed test signal application criteria; and
selectively generate the encoder failure signal based on the response to the application of the test signal.

21. The control system of claim 20 wherein the test signal is a pulse applied to the control signal.

22. The control system of claim 20 wherein the test signal is a pulse causing a magnitude of the current to move toward zero.

23. The control system of claim 19 wherein the means for detecting a failure of the means for detecting movement of the rotatable component is configured to selectively determine the zero-speed test signal application criteria is satisfied when:
no movement of the rotatable component is detected by the means for detecting movement of the rotatable component for a threshold period of time;
an absolute value of a current remains above a calibration value for the threshold period of time; and
a difference between a first filtered value of a control signal generated by the means for controlling the rotatable component and a second filtered value of the control signal remains below a threshold difference for the threshold period of time.

24. The control system of claim 23 wherein the current is a torque current and the control signal is a D-axis voltage control signal.

25. The control system of claim 19 wherein the means for detecting a failure of the means for detecting movement of the rotatable component is configured to generate the encoder failure signal when the zero-speed test signal application criteria remain satisfied for a duration of the test signal.

26. A computer-readable medium storing instructions for causing a control system to facilitate detection of a failed increment encoder by performing a method comprising:
determining whether a zero-speed test signal application criteria is satisfied: and
when the zero-speed test signal application criteria is satisfied:
applying a test signal:
measuring a response to the test signal, wherein measuring the response to the test signal comprises counting a number of pulses in an encoder channel output; and
selectively generating a signal indicating an encoder failure based on the measured response to the test signal.

27. A computer-readable medium storing instructions for causing a control system to facilitate detection of a failed increment encoder by performing a method comprising:
determining whether a zero-speed test signal application criteria is satisfied; and
when the zero-speed test signal application criteria is satisfied:
applying a test signal:
measuring a response to the test signal wherein measuring the response to the test signal comprises determining whether the zero-speed test signal application criteria remain satisfied during the application of the test signal; and
selectively generating a signal indicating an encoder failure based on the measured response to the test signal and selectively generating the signal indicating an encoder failure comprises generating the signal indicating an encoder failure when it is determined that the zero-speed test signal application criteria remained satisfied during the application of the test signal.

28. A computer-readable medium storing instructions for causing a control system to facilitate detection of a failed increment encoder by performing a method comprising:
determining whether a zero-speed test signal application criteria is satisfied; and
when the zero-speed test signal application criteria is satisfied:
applying a test signal wherein applying the test signal comprises applying a pulse to a control signal;
measuring a response to the test signal; and
selectively generating a signal indicating an encoder failure based on the measured response to the test signal.

29. A computer-readable medium storing instructions for causing a control system to facilitate detection of a failed increment encoder by performing a method comprising:
determining whether a zero-speed test signal application criteria is satisfied; and
when the zero-speed test signal application criteria is satisfied:
applying a test signal wherein applying the test signal comprises applying a pulse to cause a magnitude of a current to move toward zero;
measuring a response to the test signal; and
selectively generating a signal indicating an encoder failure based on the measured response to the test signal.

30. A computer-readable medium storing instructions for causing a control system to facilitate detection of a failed increment encoder by performing a method comprising:
determining whether a zero-speed test signal application criteria is satisfied wherein determining whether the zero-speed test signal application criteria is satisfied comprises:

determining whether a signal indicating movement of a rotatable component is received from the encoder during a threshold period of time;

determining whether a magnitude of a current remains above a calibration value for the threshold period of time;

applying a first filter and a second filter to a control signal; and determining whether a difference between the first filtered control signal and the second filtered control signal remains below a threshold difference for the threshold period of time; and when the zero-speed test signal application criteria is satisfied:

applying a test signal;

measuring a response to the test signal; and selectively generating a signal indicating an encoder failure based on the measured response to the test signal.

31. The computer-readable medium of claim 30 wherein the control signal is a D-Axis voltage control signal and the current is a Q-Axis current.

32. A computer-readable medium storing instructions for causing a control system to facilitate detection of a failed increment encoder by performing a method comprising:

determining whether a zero-speed test signal application criteria is satisfied; and when the zero-speed test signal application criteria is satisfied;

applying a test signal;

measuring a response to the test signal; and selectively generating a signal indicating an encoder failure based on the measured response to the test signal wherein selectively generating the signal indicating an encoder failure comprises generating the signal indicating an encoder failure when a signal indicating movement of a rotatable component is not received from the encoder during application of the test signal.

33. A computer-readable medium storing instructions for causing a control system to facilitate detection of a failed increment encoder by performing a method comprising:

determining whether a zero-speed test signal application criteria is satisfied: and when the zero-speed test signal application criteria is satisfied:

applying a test signal wherein the test signal is a pulse applied to a Q-axis voltage control signal; and measuring a response to the test signal; and selectively generating a signal indicating an encoder failure based on the measured response to the test signal.

* * * * *